United States Patent
Chen et al.

(10) Patent No.: US 8,713,392 B2
(45) Date of Patent: Apr. 29, 2014

(54) CIRCUITRY TESTING MODULE AND CIRCUITRY TESTING DEVICE

(75) Inventors: Xiong-Zhi Chen, Shenzhen (CN); Sung-Kuo Ku, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 65 days.

(21) Appl. No.: 13/325,014

(22) Filed: Dec. 13, 2011

(65) Prior Publication Data

US 2013/0073918 A1  Mar. 21, 2013

(30) Foreign Application Priority Data

Sep. 21, 2011 (CN) .......................... 2011 1 0281691

(51) Int. Cl.
*G06F 11/00* (2006.01)
*G01R 31/28* (2006.01)
*G08B 5/22* (2006.01)

(52) U.S. Cl.
USPC ............. 714/742; 714/736; 714/733; 714/30; 340/815.45

(58) Field of Classification Search
USPC ......... 714/733, 734, 724, 742, 745, 703, 799, 714/25, 30, 48, 736; 340/815.45, 463, 458, 340/468, 471, 475, 482–483
See application file for complete search history.

(56) References Cited

U.S. PATENT DOCUMENTS

| | | | | |
|---|---|---|---|---|
| 5,134,375 | A * | 7/1992 | Fuchi ............................. | 324/419 |
| 7,301,447 | B2 * | 11/2007 | Patel ............................. | 340/475 |
| 7,425,943 | B2 * | 9/2008 | Furukawa ..................... | 345/102 |
| 8,044,611 | B2 * | 10/2011 | Tanaka .......................... | 315/297 |

* cited by examiner

*Primary Examiner* — Christine Tu
(74) *Attorney, Agent, or Firm* — Novak Druce Connolly Bove + Quigg LLP

(57) ABSTRACT

A circuitry testing module for testing an external circuit of a Light-Emitting Diode (LED) includes at least one logic unit and a latch circuit. Two input terminals of the at least one logic unit are connected to a first end and a second of the LED correspondingly. The output terminal of the at least one logic unit is connected to the latch circuit. If the external circuit works normally, the logic unit outputs a first logic operating signal to the latch unit, and the latch circuit outputs a first latch signal. If the external circuit does not work normally, the logic unit outputs a second logic operating signal to the latch unit, and the latch circuit outputs a second latch signal.

10 Claims, 2 Drawing Sheets

CIRCUITRY TESTING MODULE AND CIRCUITRY TESTING DEVICE

BACKGROUND

1. Technical Field

The disclosure generally relates to circuitry testing modules and circuitry testing devices using the circuitry testing module, and particularly to a circuitry testing module and a circuit testing device used to test external circuits connected to light-emitting diodes (LEDs).

2. Description of Related Art

LEDs are widely used in electronic devices to indicate different working states of the electronic devices. Thus, before using the LEDs on the electronic devices, it is necessary to ensure that an external circuit of the electronic devices connected to the LEDs can work normally, and prevent the LEDs from correctly indicating the work states of the electronic devices because of the external circuit.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the disclosure.

DETAILED DESCRIPTION

Figure 1:
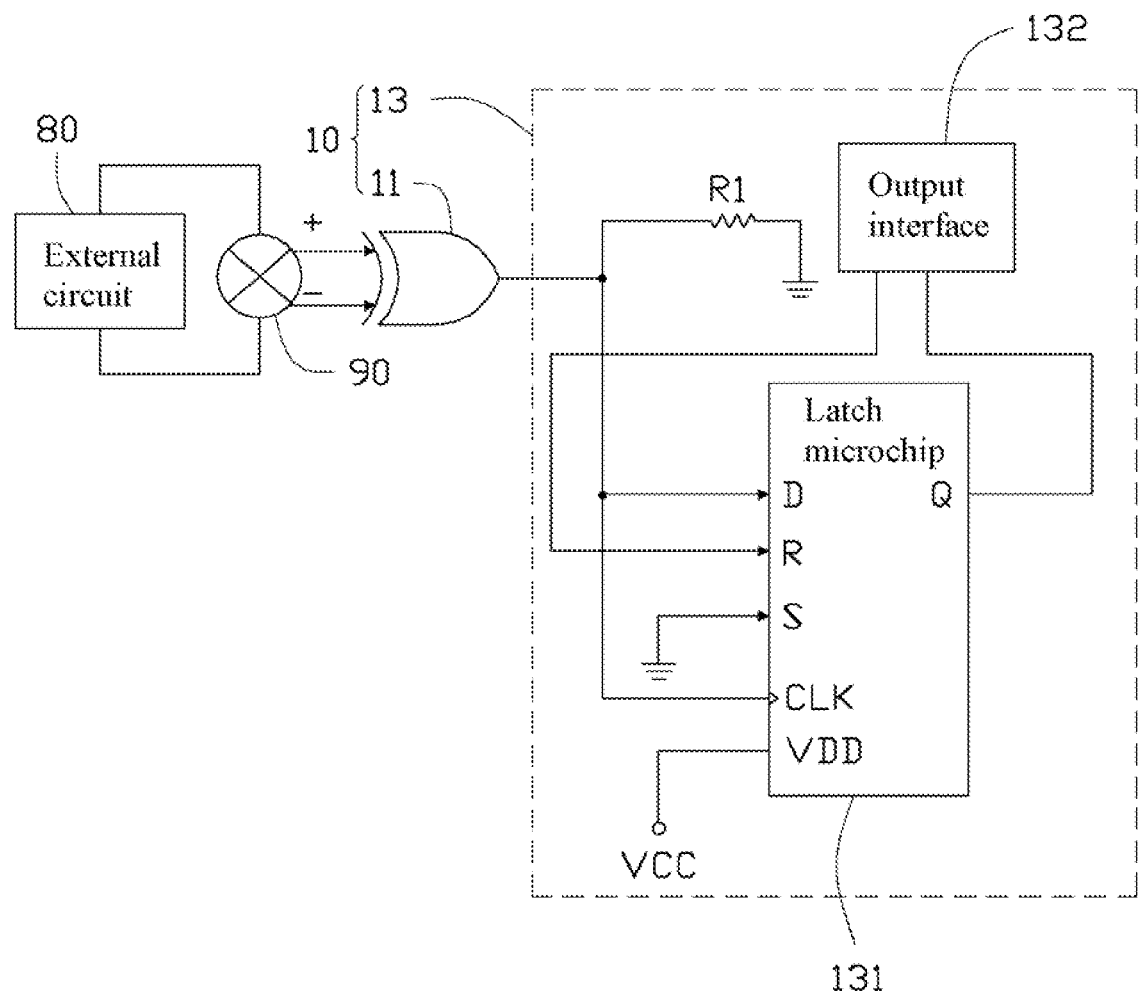
FIG. 1 is a circuit diagram of a circuitry testing module for testing an external circuit of an LED, according to an exemplary embodiment of the disclosure.

FIG. 1 is a circuit diagram of a circuitry testing module 10 for testing an external circuit of an LED 90, according to an exemplary embodiment of the disclosure. The circuitry testing module 10 includes at least one logic unit 11 and a latch circuit 13. The LED 90 includes a first end and a second end. The circuitry test module 10 is used to test an external circuit 80 connected to the first end and the second end of LED 90. If the external circuit 80 works normally, the LED 90 is turned on, and a voltage drop is formed between the first end and the second end of the LED 90. If the external circuit 80 does not work normally, due to a short circuit or an open circuit, the LED 90 is turned off, and the first end and the second end of the LED 90 do not have a voltage drop between them (i.e. a voltage difference between the first end and the second end of the LED 90 is about zero). Therefore, the external circuit 80 can be tested according to the voltage drop between the first end and the second end of the LED 90.

The logic unit 11 is an exclusive-OR gate. Two input terminals of the logic unit 11 are respectively electronically connected to the first end and the second end of the LED 90. Thus, if the LED 90 is turned on, a logic 1 signal (i.e. a high voltage level signal) and a logic 0 signal (i.e. a low voltage level signal) are respectively input into the two input terminals of the logic unit 11. Thus, the logic unit 11 outputs a logic 1 signal (i.e. a high voltage level signal) as a first logic operating signal to the latch circuit 13. If the LED 90 is turned off, two logic 1 signals or two logic 0 signals are input into the input terminal of the logic unit 11. Thus, the logic unit 11 outputs a logic 0 signal (i.e. a low voltage level signal) as a second logic operating signal to the latch circuit 13.

The latch circuit 13 includes a latch microchip 131 and an output interface 132. The latch microchip 131 includes a power supply contact VDD, a clock contact CLK, a set contact S, a data contact D, a reset contact R, and an output contact Q.

The power supply contact VDD is electrically connected to a power supply, such as a 5V DC power supply. The clock contact CLK and the data contact D are connected to an output terminal of the logic unit 11 and are grounded through a first resistor R1. When the logic unit 11 outputs the high voltage level signal, the clock contact CLK turns to a high voltage level from an initial low voltage level and triggers the data contact D to receive the high voltage level signal. When the logic unit 11 outputs the low voltage level signal, the clock contact CLK has no action.

The set contact S and the reset contact R are connected to the output interface 132. The set contact S and the reset contact R are configured for setting states of the latch microchip 131. The set contact S is grounded. The reset contact R is connected to an external control apparatus (not shown) and controlled by the external control apparatus (not shown) to switch the states of the latch microchip 131. The output contact Q is connected to the output interface 132. In default, the reset contact R is set at a low voltage level, and the output contact correspondingly outputs a low level voltage signal. When the reset contact R is at a high voltage level, the latch microchip 131 is in a reset state to clear information about a last circuitry test and prepare for a next circuitry test. During a circuitry test, the reset contact R is set at a low voltage level by the external control apparatus, so the latch microchip 131 is switched to a latch state. In the latch state, the latch microchip 131 outputs a latch signal to stably indicate a current state of the external circuit 80.

In this embodiment, once the data contact D receives the first logic operating signal output from the logic unit 11. The output contact Q outputs a first latch signal, i.e., a high level voltage signal, which indicates the external circuit 80 works normally, to the output interface 132 to latch the current state (i.e. a normally working state) of the external circuit 80 until the test is over. Otherwise, the data contact D does not receive the first logic operating signal output from the logic unit 11, the output contact Q outputs a second latch signal, i.e., a low level voltage signal, which indicates the external circuit 80 does not work normally to the output interface 132 to latch the current state (i.e. an abnormally working state) of the external circuit 80 until the test is over. Thus, even if the LED flashes and the voltage drop between the first end and the second end is correspondingly unstable, the circuitry testing module 10 can get the correct state of the tested external circuit 80 and output a stable test result.

Figure 2:
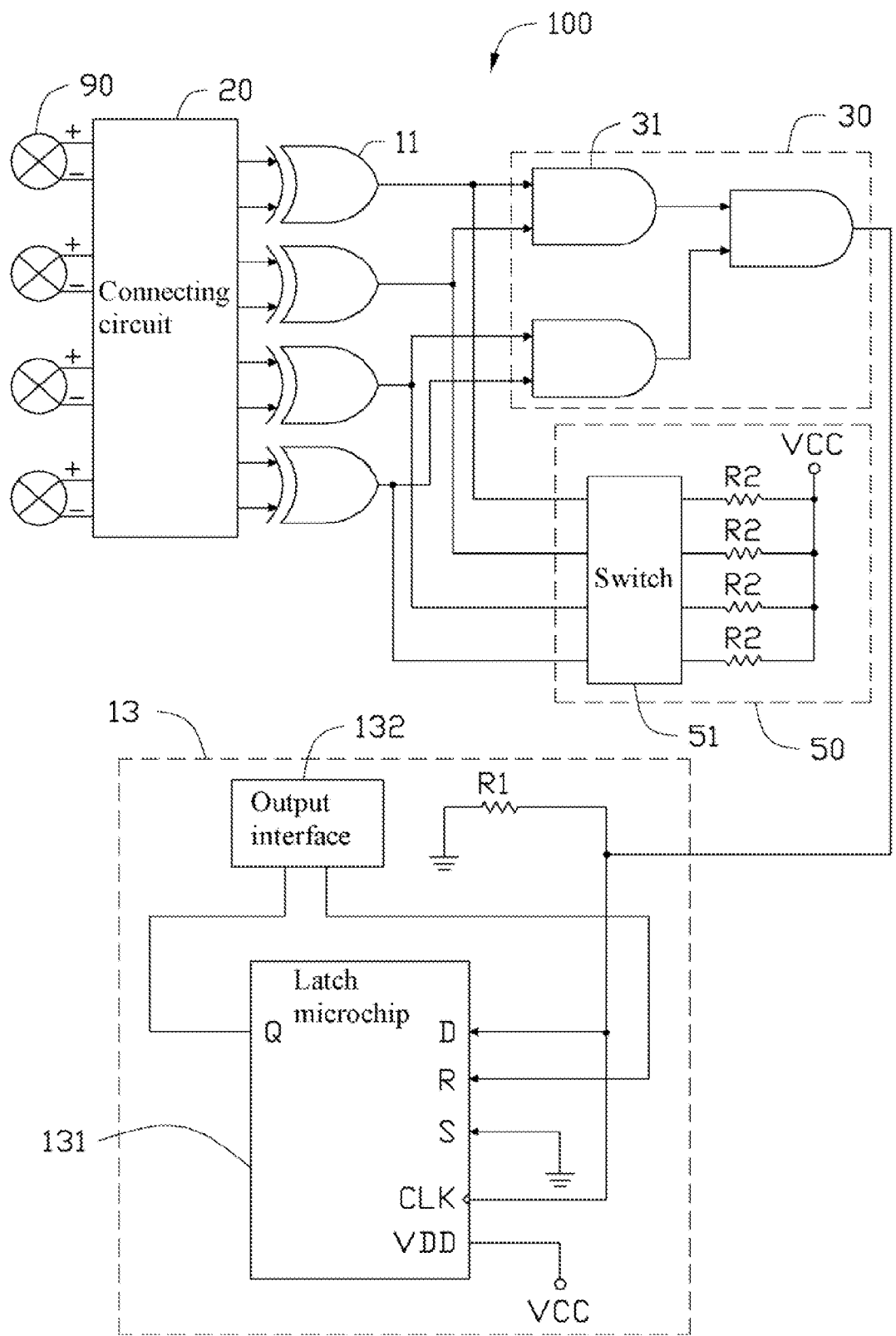
FIG. 2 is a circuit diagram of a circuitry testing device for testing an external circuit of multiple LEDs, according to an exemplary embodiment of the disclosure.

FIG. 2 is a circuit diagram of a circuitry testing device 100 for testing an external circuit of multiple LEDs, according to an exemplary embodiment of the disclosure. The circuitry testing device 100 includes a circuitry test module 10 described above, a connecting circuit 20, and a logic operating circuit 30. In this embodiment, the circuitry test module 10 includes four logic units 11 respectively corresponding to the four LEDs 90 shown in FIG. 2. The input terminals of each logic unit 11 are connected to the first end and the second end of a corresponding LED 90 via the connecting circuit 20. The connecting circuit 20 is a connector used to interconnect the logic units 11 and the logic operating circuit 30. The output terminal of each logic unit 11 is electrically connected to the logic operating circuit 30.

The logic operating circuit 30 includes a plurality of AND gates 31 cascaded between the logic units 11 and the latch circuit 13. In this embodiment, there are three AND gates 31 including two front AND gates and one rear AND gates. Each output terminal of the four logic units 11 is respectively and electronically connected to one of the input terminals of the two front AND gates 31. The output terminal of each front AND gate 31 is connected to an input terminal of the rear AND gate 31. The output terminal of the rear AND gate 31 is electronically connected to the data contact D and the clock contact CLK of the latch circuit 13.

To test the external circuit 80, if the external circuit 90 works normally, the logic operating circuit 30 output a logic 1 signal (i.e. a high voltage level signal) to the clock contact CLK, the clock contact CLK triggers the data contact D to receive the high voltage level signal. Thus, the output contact Q maintains a corresponding high voltage level as the first latch signal to the output interface 131. If the external circuits 80 does not work normally, the logic operating circuit 30 output a logic 0 signal (i.e. a low voltage level signal) to the clock contact CLK, the output contact Q maintains a corresponding low voltage level output as the second latch signal.

In other embodiments, the testing device 100 further includes a control module 50 connected to the logic units 11. The control module 50 includes a switch 51 and a plurality of second resistors R2. The switch 51 includes a first group of contacts and a second group of contacts corresponding to the first group of contacts. The first group of contacts are connected to the power supply VCC through corresponding second resistors R2. The second group of contacts are respectively electronically connected to the corresponding output terminals of the logic units 11. When part of the logic unit 11 is idle, the contact in the first group corresponding to the idle logic unit 11 connects to the corresponding contact in the second group. Thus, the idle logic unit 11 outputs a logic 1 signal to the logic operating circuit 30 and have no influence on the test.

The circuit testing module 10 can be used to test the external circuit 80 of the LED 90, prevents the LED 90 from indicating the work states of the electronic devices because of the external circuit 80. In addition, the circuit testing module 100 can test multiple LEDs 90 together and has a relative higher efficiency.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A circuitry testing module for testing an external circuit of a light emitting diode (LED), the LED comprising a first end and a second end, the circuitry testing module comprising:
  at least one logic unit having two input terminals connecting to the first end and the second end of the LED correspondingly; and
  a latch circuit connected to an output terminal of the at least one logic unit; wherein in response to normal operation of the external circuit determined by the at least one logic unit, the latch circuit outputs a first latch signal; and in response to abnormal operation of the external circuit determined by the at least one logic unit, the latch circuit outputs a second latch signal;
  wherein the latch circuit comprises a microchip, the microchip comprises a power supply contact connected to a power supply, a clock contact, a data contact and an output contact; the clock contact and the data contact are connected to the output terminal of the logic unit and grounded by a first resistor; when the at least one logic unit determines the external circuit works normally, the logic unit outputs a first logic operating signal to the clock contact, the clock contact triggers the data contact to receive the first logic operating signal, the output contact outputs the first latch signal; otherwise when the at least one logic unit determines the external circuit works abnormally, the data contact does not receive the first logic operating signal output from the logic unit, the output contact outputs the second latch signal.

2. The circuitry testing module of claim 1, wherein the logic unit is an exclusive-OR gate.

3. The circuitry testing module of claim 2, wherein the first logic operating signal is a high voltage level signal.

4. The circuitry testing module of claim 1, wherein the latch circuit further comprises an output interface, the latch microchip further comprises a set contact and a reset contact, the reset contact and the output contact are connected to the output interface, the reset contact is grounded, when the reset contact is set at a low voltage level, the latch microchip is switched to a latch state, in the latch state, the latch microchip outputs a signal to indicate a current state of the external circuit.

5. A circuitry testing device for testing an external circuit of multiple light emitting diodes (LEDs), each LED comprising a first end and a second end , the circuitry testing device comprising:
  a connecting circuit;
  a plurality of logic units, each of the logic units having two input terminals connecting to the first end and the second end of one of the LEDs correspondingly through the connecting circuit;
  a logic operating circuit connected to the logic units; and
  a latch circuit, the latch circuit connected to an output terminal of the logic operating circuit, each of the logic units performing a logic OR operation; wherein in response to normal operation of the external circuit determined by at least one of the logic units, the latch circuit outputs a first latch signal; and in response to abnormal operation of the external circuit determined by at least one of the logic units, the latch circuit outputs a second latch signal;
  wherein the latch circuit comprises a microchip, the microchip comprises a power supply contact connected to a power supply, a clock contact, a data contact and an output contact, the clock contact and the data contact are connected to the output terminal of the logic operating circuit and grounded by a first resistor; when the at least one of the logic units determine the external circuit works normally, the logic operating circuit outputs a first logic operating signal to the clock, the clock contact triggers the data contact to receive the first logic operating signal, the output contact outputs the first latch signal; otherwise when the at least one of the logic units determine the external circuit works abnormally, the data contact does not receive the first logic operating signal output from logic operating circuit, the output contact outputs the second latch signal.

6. The circuitry testing device of claim 5, wherein the logic operating circuit comprising a plurality of GND gates cascaded between the logic units and the latch circuit.

7. The circuitry testing device of claim 5, wherein each of the logic units is an exclusive-OR gate.

8. The circuitry testing device of claim 5, wherein the first logic operating signal is a high voltage level signal.

9. The circuitry testing device of claim 5, wherein the latch circuit further comprises an output interface, the latch microchip further comprise a set contact and a reset contact, the reset contact and the output contact are connected to the output interface, the set contact is grounded, when the reset contact is set at a low voltage level, the latch microchip is switched to a latch state, in the latch state, the latch microchip outputs a signal to indicate a current state of the external circuit.

10. The circuitry testing device of claim 5, further comprises a control circuit, the control circuit includes a switch and a plurality of second resistors, a first group of contacts and a second group of contacts corresponding to the first group of contacts, the first group of contacts are connected the power supply through the second resistors; the second group of contacts are respectively connected to the output terminals of the logic unit; when some of the logic units are idle, the contacts in the first group corresponding to the idle logic unit connects to the corresponding contacts in the second group.

* * * * *